(12) United States Patent
Kao et al.

(10) Patent No.: US 6,187,618 B1
(45) Date of Patent: Feb. 13, 2001

(54) VERTICAL BIPOLAR SRAM CELL, ARRAY AND SYSTEM, AND A METHOD FOR MAKING THE CELL AND THE ARRAY

(75) Inventors: David A. Kao, Meridian; Fawad Ahmed, Boise, both of ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/249,469

(22) Filed: Feb. 12, 1999

Related U.S. Application Data

(62) Division of application No. 09/070,706, filed on Apr. 30, 1998, now Pat. No. 5,907,503, which is a division of application No. 08/867,829, filed on Jun. 2, 1997, now Pat. No. 5,896,313.

(51) Int. Cl.[7] .................................................. H01L 21/331
(52) U.S. Cl. .......................... 438/202; 438/234; 438/238
(58) Field of Search ..................... 438/202, 234, 438/238, FOR 186, FOR 212, FOR 220

(56) References Cited

U.S. PATENT DOCUMENTS

| | | |
|---|---|---|
| 5,055,904 | * 10/1991 | Minami et al. . |
| 5,324,982 | 6/1994 | Nakazato et al. . |
| 5,453,636 | 9/1995 | Eitan et al. . |
| 5,483,483 | 1/1996 | Choi et al. . |
| 5,508,966 | 4/1996 | Nakase . |
| 5,594,261 | 1/1997 | Temple . |
| 5,594,265 | 1/1997 | Shimizu et al. . |
| 5,594,683 | 1/1997 | Chen et al. . |
| 6,033,947 | * 3/2000 | Cacciola et al. . |
| 6,096,608 | * 3/2000 | Williams . |

OTHER PUBLICATIONS

*Analysis and Design of Digital Integrated Circuits*, 2nd Edition, by David Hodges, pp. 364–368, 1988.

* cited by examiner

Primary Examiner—George Fourson
Assistant Examiner—Joannie A. Garcia
(74) Attorney, Agent, or Firm—Killworth, Gottman, Hagan & Schaeff, L.L.P.

(57) ABSTRACT

An SRAM memory cell is provided in which a pair of cross-coupled n-type MOS pull-down transistors are coupled to respective parasitically formed bipolar pull-up transistors. The memory cell is formed within a semiconductor layer which extends over a buried layer. The bipolar transistors are formed parasitically from the buried layer and the semiconductor layer used to form the pull-down transistors. The bases of the bipolar transistors may also be dynamically controlled. An SRAM memory array having a plurality of such memory cells and a computer system incorporating the SRAM memory array are also provided.

5 Claims, 9 Drawing Sheets

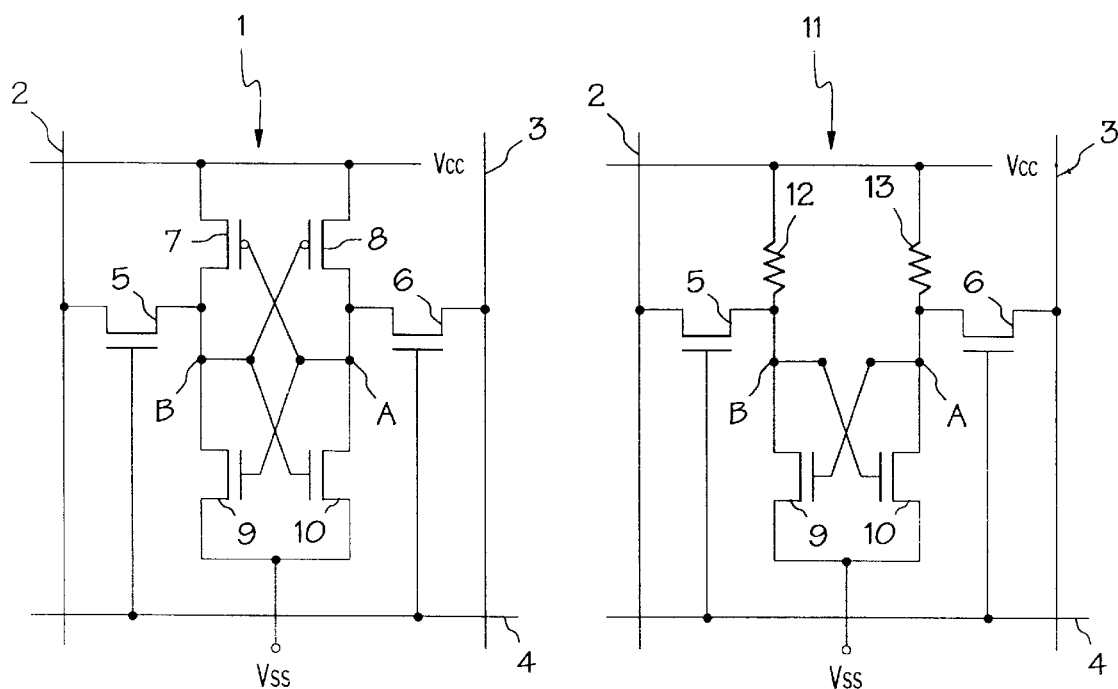
FIG. 1
PRIOR ART
FIG. 2
PRIOR ART
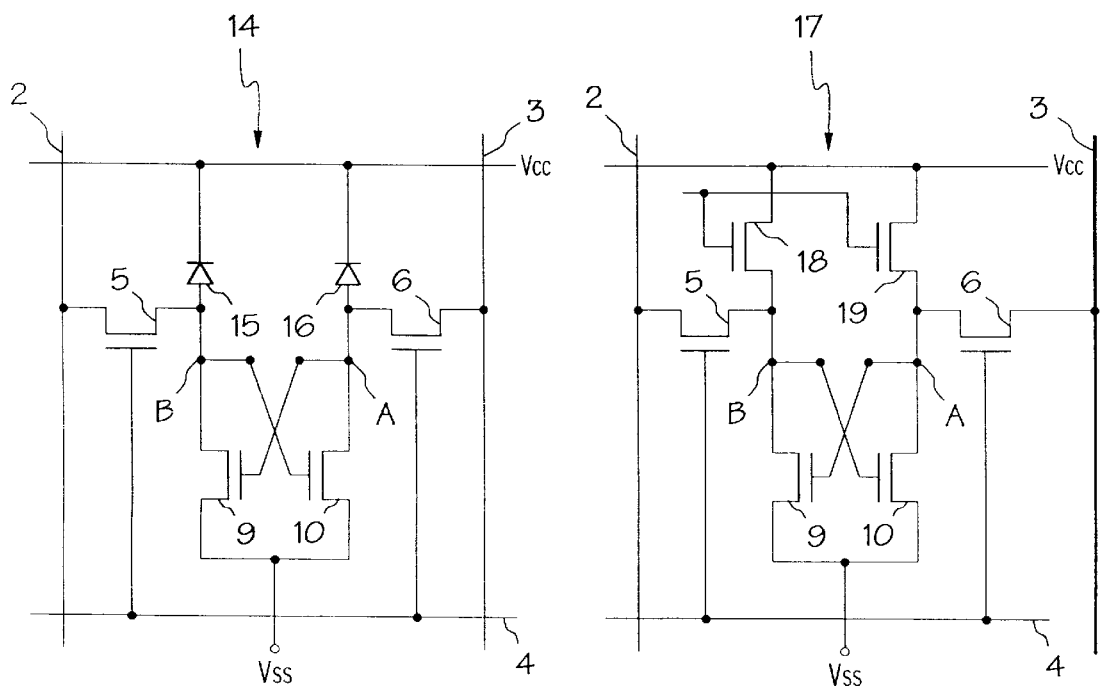
FIG. 3
PRIOR ART
FIG. 4
PRIOR ART

VERTICAL BIPOLAR SRAM CELL, ARRAY AND SYSTEM, AND A METHOD FOR MAKING THE CELL AND THE ARRAY

CROSS-REFERENCE TO RELATED APPLICATION

This is a divisional application of application Ser. No. 09/070,706 filed on Apr. 30, 1998 now U.S. Pat. No. 5,907,5030 by Kao et al. which is a divisional application of application Ser. No. 08/867,829 filed on Jun. 2, 1997 now U.S. Pat. No. 5,896,313, by Kao et al.

BACKGROUND OF THE INVENTION

The present invention relates in general to a static random access memory (SRAM), and, more particularly, to an SRAM having a vertical bipolar pull-up transistor.

SRAM chips are well known in the art. An SRAM chip is conventionally structured in rows and columns of individual SRAM cells. A prior art six transistor CMOS SRAM cell 1 is shown schematically in FIG. 1. The SRAM cell 1 includes two p-type pull-up transistors 7, 8 acting as load devices, two n-type access transistors 5, 6, and two n-type pull-down transistors 9, 10. The SRAM cell 1 has two states: logic state "0" and logic state "1". By convention, if logic state "0" is designated by node A having a high voltage and node B having a low voltage, then logic state "1" has the opposite stored voltages, i.e. node A having a low voltage and node B having a high voltage.

In logic state "0" the high voltage on node A turns on the pull-down transistor 9 and turns off the pull-up transistor 7, whereas the low voltage on node B turns off the pull-down transistor 10 and turns on the pull-up transistor 8. Because the pull-down transistor 9 is on and the pull-up transistor 7 is off, current flows through the pull-down transistor 9 to a voltage supply $V_{SS}$ (ground), thereby maintaining a low voltage on node B. Because the pull-up transistor 8 is turned on and the pull-down transistor 10 is turned off, current flows from a voltage supply $V_{CC}$ through the pull-up transistor 8, thereby maintaining a high voltage on node A.

To change the state of the SRAM cell 1 from a logic "0" to a logic "1", a column line 3 and a column line complement 2 are provided with a low and a high voltage, respectively. Then, the access transistors 5 and 6 are turned on by a high voltage on a row line 4, thereby providing the low voltage on the column line 3 to node A and the high voltage on the column line complement 2 to node B. Accordingly, the pull-down transistor 9 is turned off and the pull-up transistor 7 is turned on by the low voltage on node A and the pull-down transistor 10 is turned on and the pull-up transistor 8 is turned off by the high voltage on node B, thereby switching the state of the circuit from logic "0" to logic "1". Following the switching of the state of the SRAM cell 1, the access transistors 5 and 6 are turned off (by applying a low voltage on row line 4). The SRAM cell 1 maintains its new logic state in a manner analogous to that described above.

However, a CMOS SRAM cell has a major disadvantage in that such a cell requires a large area on a chip surface. Each of the p-type pull-up transistors 7, 8 require a separate n-well structure which increases the size of each SRAM cell. Further, additional processing steps are required in order to form the n-well structures.

Another prior art SRAM cell 11 is shown in FIG. 2, with a pair of load resistors 12 and 13 acting as the load devices. The load resistors 12, 13 typically have a high resistance in the range of $1\times10^8$ to $1\times10^{10}$ ohms. The replacement of the pull-up transistors 7, 8 with the resistors 12, 13 decreases the size of the memory cell 11. However, the high resistance values of the load resistors 12, 13 increases the power consumption in the SRAM cell 11. Although it is well known in the art to produce high resistance resistors on a small surface area by ion-implanted polysilicon to provide the desired resistance levels, there are a number of serious problems to be overcome.

For example, controlling the resistance of polysilicon during fabrication is extremely difficult. Although the load resistors 12, 13 may be fabricated from the same layer of polysilicon used to form the polysilicon gates of the transistors 5, 6, 9, 10, typically two polysilicon layers are necessary. Specifically, one polysilicon layer is used for the load resistors 12, 13 and $V_{CC}$, and another polysilicon layer is used for the gates of the transistors 5, 6.

However, even if the SRAM cell 11 is fabricated with two polysilicon layers, the SRAM cell 11 still has several disadvantages. First, the load resistors 12, 13 are fabricated by a complex process which produces devices having substantial variations in resistance. These variations result in low yield for such processes. Second, the load resistors 12, 13 must provide a current which is higher than the leakage current, i.e. typically in the range of $2-10\times10^{-14}$ amps, from nodes A and B while not exceeding a level of current that creates a stand-by current problem. Providing a suitable load resistor which has high enough resistance to provide a current in this range is difficult because the load resistor must have a very high resistance, yet must occupy only a small area of the chip surface. As the density of SRAM cells in an array increases, the operating window for the resistance variation of the load resistors becomes smaller.

Another prior art SRAM cell 14 is shown in FIG. 3, with a pair of diodes 15, 16 acting as the load devices. Typically, the diodes 15, 16 are fabricated using polysilicon. However, polysilicon diodes tend to have high leakage current which increases the power consumption of the SRAM cell. Further, SRAM cells using polysilicon diodes as the load devices require three layers of polysilicon which increases the number of fabrication steps.

Another prior art SRAM cell 17 is shown in FIG. 4, with a pair of thin-film transistors 18, 19 acting as the load devices. Thin-film transistors are fabricated using polysilicon and therefore suffer the same leakage current and process disadvantages of the polysilicon diodes of FIG. 3.

Another prior art SRAM cell is disclosed in U.S. Pat. No. 5,453,636, issued to Eitan et al., in which a pair of open-base bipolar transistors are used as the load devices. The open-base bipolar transistors provide the current needed to compensate for the leakage current to the substrate or through the field effect transistors to keep the common node at the appropriate voltage level. The bipolar transistors are formed in the same p-type substrate as the other transistors of the SRAM cell. Unfortunately, such an SRAM cell suffers from the same disadvantage as the SRAM cell of FIG. 1 in that the cell requires a large area on the chip surface since each bipolar transistor is separately formed in the substrate. Further, additional metalization steps are required to connect the collector or emitter of every bipolar transistor to the appropriate voltage source contact.

There is an ongoing need for improved SRAM cell structures which provide superior performance yet occupy a reduced area on an SRAM chip. Preferably, such improved SRAM cell structures would include a controllable pull-up device to further improve the operating characteristics of an SRAM including the cell structures.

SUMMARY OF THE INVENTION

The present invention meets this need by providing an SRAM memory cell in which a bipolar pull-up transistor is parasitically formed in the layers used to form a metal oxide semiconductor (MOS) pull-down transistor. By using a parasitic bipolar pull-up transistor, the memory cell occupies a reduced area on the SRAM chip and provides superior performance. The performance of the SRAM memory cell is further improved by controlling the conductivity of the pull-up transistor. Thus, the use of the parasitic bipolar pull-up transistor simplifies formation of the SRAM memory cell, reduces its surface area on a chip when compared to the prior art wherein such devices were formed adjacent to the SRAM memory cell and occupied additional surface area, and in addition provides improved performance.

According to a first aspect of the present invention, the SRAM memory cell is formed from a first semiconductor layer of a first conductivity type and a second semiconductor layer of a second conductivity type. The second semiconductor layer covers the first semiconductor layer so that the first semiconductor layer is a buried layer. The MOS pull-down transistor is formed in an upper surface of the second semiconductor layer. The second semiconductor layer extends between the MOS pull-down transistor and the buried layer thereby forming the parasitic bipolar pull-up transistor.

According to another aspect of the present invention, the SRAM memory cell includes a pair of cross coupled MOS pull-down transistors. The cross-coupled pull-down transistors are coupled to respective first and second bipolar transistors. An input line is coupled to the cross-coupled pull-down transistors so as to change the state of the memory cell from a first logic state to a second logic state. The bases of the bipolar pull-up transistors are coupled to a switching circuit so as to change the conductivity of the bipolar pull-up transistors, thereby improving the operating characteristics of the memory cell.

According to further aspects of the present invention, an SRAM memory array incorporating the above SRAM memory cells is provided as well as a computer system incorporating the above SRAM memory array. The present invention also includes methods for making the above SRAM memory cells, the SRAM memory arrays, and the computer system.

One object of the present invention is to provide an SRAM memory cell having bipolar pull-up transistors parasitically formed between the MOS pull-down transistors and a buried layer. Another object of the present invention is to provide an SRAM memory cell in which the bases of the bipolar pull-up transistors are dynamically controlled so as to improve the performance of the SRAM cell. Yet another object of the present invention is to provide an SRAM memory cell in which the bipolar pull-up transistors are formed vertically, thereby reducing the surface area of the memory chip. A further object of the present invention is to provide an SRAM memory cell having only two layers of polysilicon, thereby reducing the number of process steps. Another further object of the present invention is to provide an SRAM memory array having a plurality of SRAM memory cells as described above. Yet a further object of the present invention is to provide a computer system having an SRAM memory array as described above. Yet another further object of the present invention is to provide a method for making the above SRAM memory array and computer system.

Other objects and advantages of the invention will be apparent from the following description, the accompanying drawings and the appended claims.

BRIEF DESCRIPTION OF THE DRAWINGS

FIG. 1 illustrates a prior art SRAM memory cell in which p-type MOS transistors are used as load devices;

FIG. 2 illustrates a prior art SRAM memory cell in which resistors are used as load devices;

FIG. 3 illustrates a prior art SRAM memory cell in which polysilicon diodes are used as load devices;

FIG. 4 illustrates a prior art SRAM memory cell in which thin-film transistors are used as load devices;

DETAILED DESCRIPTION OF THE PREFERRED EMBODIMENTS

Figure 5:
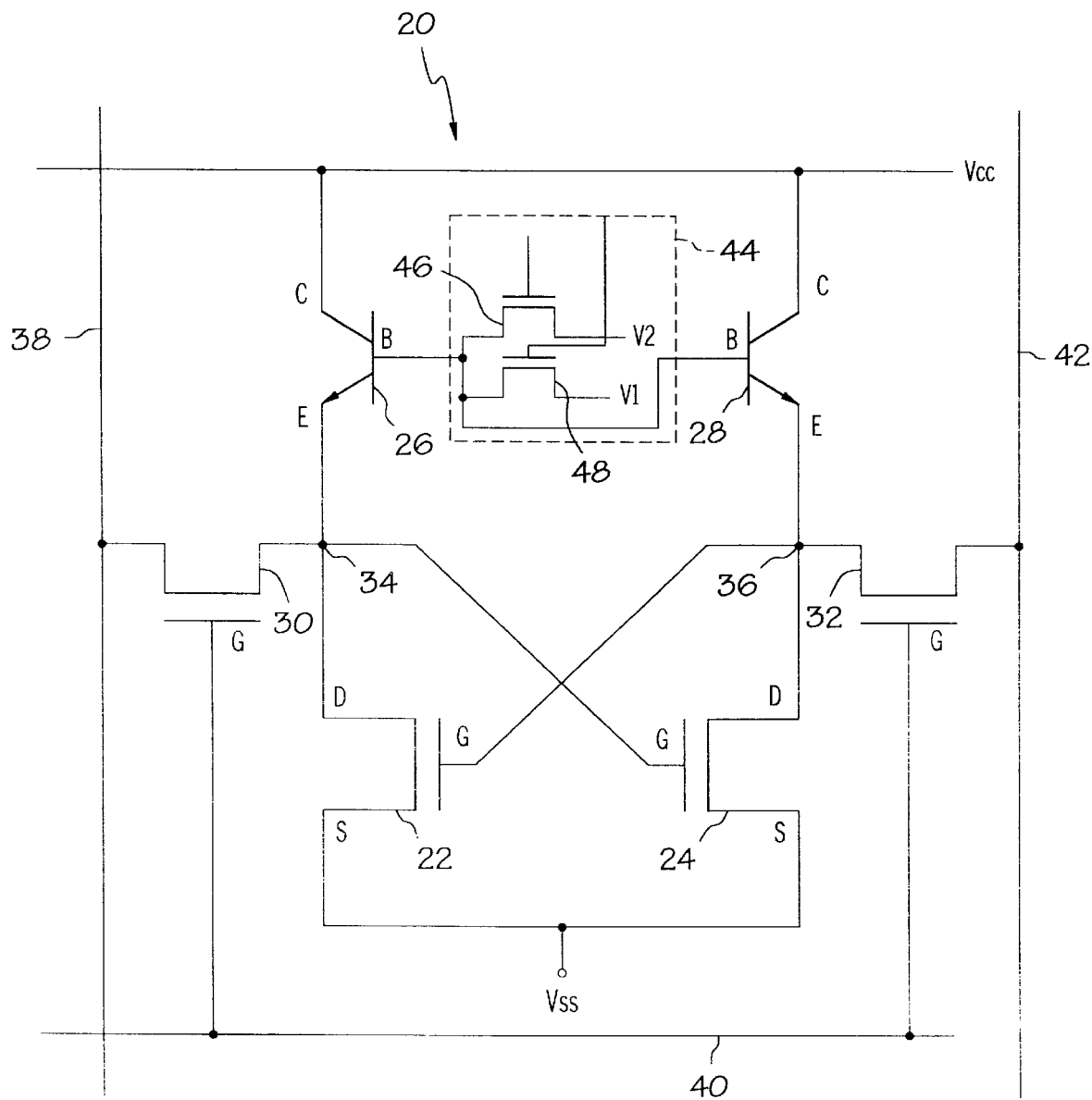
FIG. 5 illustrates schematically an SRAM memory cell in accordance with the present invention.

FIG. 5 illustrates schematically an SRAM memory cell 20 in accordance with the present invention. The SRAM memory cell 20 includes a first MOS (n-type) pull-down transistor 22, a second MOS (n-type) pull-down transistor 24, a first NPN bipolar pull-up transistor 26, a second NPN bipolar pull-up transistor 28, a third MOS or first access transistor 30 and a fourth MOS or second access transistor 32. The MOS transistors 22 and 24 each include a drain (D), a gate (G) and a source (S) while the bipolar transistors 26 and 28 each include a collector (C), a base (B) and an emitter (E). It will be appreciated by those skilled in the art that the drain and source terminals of a MOS transistor are typically identical with the drain/source label being applied for descriptive purposes once a voltage is applied to the transistor. For n-type transistors, the drain designation is applied to the terminal having the higher voltage potential with the source designation being applied to the other terminal. Accordingly, separate drain/source designations have not been applied to the access transistors 30 and 32 as voltages across the drain/source terminals change in such a manner as to cause corresponding changes in drain/source designations for the access transistors 30 and 32.

The collectors of the pull-up transistors 26 and 28 are coupled to a first voltage source or $V_{CC}$. The emitters of the pull-up transistors 26 and 28 are coupled to a first node 34 and a second node 36, respectively. The drains of the pull-down transistors 22 and 24 are coupled to the first node 34 and the second node 36, respectively. The sources of the pull-down transistors 22 and 24 are coupled to a second voltage source or $V_{SS}$. Typically, $V_{CC}$ is approximately 5.0 volts to 2.0 volts, depending on the process and technology, while $V_{SS}$ is approximately zero volts or ground. The pull-down transistors 22 and 24 are cross-coupled with the drain of the first pull-down transistor 22 coupled to the gate of the second pull-down transistor 24 and the drain of the second pull-down transistor 24 coupled to the gate of the first pull-down transistor 22.

One of the drain/source terminals of the first access transistor 30 is coupled to the first node 34 while the other drain/source terminal is coupled to a first bit or column line 38. The gate of the first access transistor 30 is coupled to a word or row line 40. Similarly, one of the drain/source terminals of the second access transistor 32 is coupled to the second node 36 while the other drain/source terminal is coupled to a second bit or column line 42. The gate of the second access transistor 30 is coupled to the word or row line 40. Typically, the first and second column lines receive symmetrical data pulses with one of the column lines receiving the complement of the other column line. It should be apparent that the first and second access transistors 30 and 32 function as an input line for providing access to the memory cell 20.

The bases of the first and second bipolar pull-up transistors 26, 28 are coupled to a switching circuit 44 for switching both of the bases to one of a plurality of voltages. In the illustrated embodiment, the bases may be coupled to ground a negative voltage or left floating. The switching circuit 44 includes a fifth transistor 46 and a sixth transistor 48. The gates of the transistors 46 and 48 may be coupled to a control circuit (not shown) for controlling the functionality of the switching circuit 44.

It will be appreciated by those skilled in the art that the complement of the SRAM memory cell 20 may be used by switching the n-type MOS transistors with p-type MOS transistors and by switching the NPN bipolar transistors to PNP bipolar transistors and biasing appropriately. It will be further appreciated by those skilled in the art that the MOS access transistors and the pass transistors may be n-type or p-type depending on the gate voltages. In the illustrated embodiment, all of the MOS transistors are n-type and all of the bipolar transistors are NPN.

For illustrative purposes it is assumed that logic state "0" is designated by node 34 having a low voltage and node 36 having a high voltage while logic state "1" is designated as node 34 having a high voltage and node 36 having a low voltage. Logic state "0" therefore has the effect of turning off the pull-down transistor 24 and turning on the pull-down transistor 22 while logic state "1" has the opposite effect. The collectors of the pull-up transistors 26, 28 are biased at $V_{CC}$ constantly. The emitters of the pull-up transistors 26, 28 switch between zero volts and VCC ("0" and "1"). Therefore, the collector junctions are always reverse biased while the emitter junctions will never be forward biased. Thus, the pull-up transistors 26, 28 will always be off providing a high resistance pull-up load.

The SRAM memory cell 20 then operates as follows. During a Write cycle in which the logic state "1" is written to the memory cell 20, the row line 40 is switched high thereby activating the access transistors 30 and 32. The first column line 38 is forced to a precharged value, approximately $V_{CC}/2$, while the second column line 42 is forced low. The switching circuit 44 also grounds the bases of the pull-up transistors 26 and 28. Grounding the bases of the pull-up transistors 26 and 28 during the Write cycle improves the operating characteristics of the memory cell 20 in a number of ways. First, as the n-type MOS pull-down and access transistors 22, 24, 26 and 28 are typically formed in a p-well, any carriers in the p-well are drawn off so that the accessed memory cell does not affect adjacent memory cells. Further, $BV_{CEO}$ is avoided with the bases grounded instead of floating. Further yet, the resistance characteristics of the pull-up transistors 26 and 28 are not needed during the Write cycle as the leakage current may be high.

The second access transistor 32 is designed such that its conductance is much larger than that of the second bipolar pull-up transistor 28 so that the drain of the second pull-down transistor 24 and the gate of the first pull-up transistor 22 are brought below the threshold voltage, $V_t$, as the low voltage on the second column line 42 is transferred to the node 36. The first pull-down transistor 22 turns off and the drain potential of the transistor 22 and the node 34 rises due to the current flow from the first access transistor 30. The increased drain potential at the node 34 causes the second pull-down transistor 24 to turn on, thereby lowering the potential of the drain of the transistor 24 and the node 36, and thus keeping the transistor 22 off. The row line 40 is returned to a standby state leaving the memory cell in its desired logic state.

Figure 6:
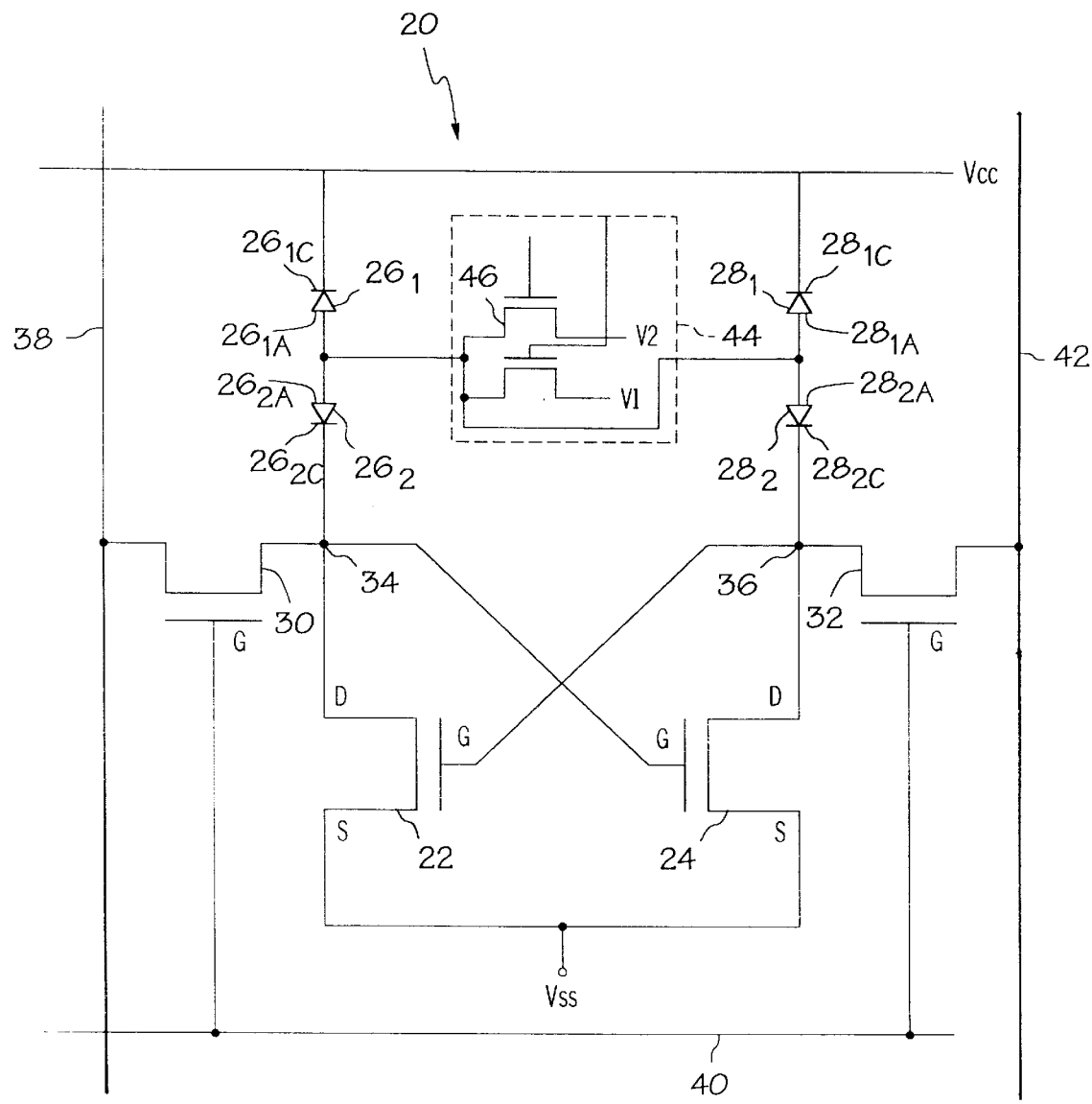
FIG. 6 illustrates schematically the SRAM memory cell of FIG. 5 according to another aspect of the present invention.

The bases of the bipolar pull-up transistors 26 and 28 are floating or slightly negative, i.e. −1 volts, in standby mode. The bipolar transistors 26, 28 therefore act as back-to-back diodes, $26_1$, $26_2$, $28_1$ and $28_2$ as shown in FIG. 6. By convention, a first cathode $26_{1C}$ of the first diode $26_1$ is coupled to $V_{CC}$ and a first anode $26_{1A}$ is coupled to a first anode $26_{2A}$ of the second diode $26_2$ while a first cathode $26_{2C}$ is coupled to node 34. Similarly, a third cathode $28_{1C}$ of the third diode $28_1$ is coupled to $V_{CC}$ and a third anode $28_{1A}$ is coupled to a fourth anode $28_{2A}$ of the fourth diode $28_2$ while a fourth cathode $28_{2C}$ is coupled to node 36. As long as the reverse/leakage current of the first bipolar pull-up transistor 26 is larger than the OFF current of the first pull-down transistor 22, the memory cell will remain in its stable configuration. While the leakage current of the bipolar transistors 26, 28 is sufficient to maintain the state of the memory cell 20 when the bases are floating, the bases may be biased slightly negative so as to raise the $V_t$ of the access transistors 30 and 32 and therefore better isolate them.

Referring again to FIG. 5, during a Read cycle in which a logic "1" is read from the memory cell 20, the first and second column lines 38, 42 are biased to $V_{CC}/2$, the row line 40 is forced high and the bases of the bipolar transistors 26 and 28 are grounded. The bases of the bipolar transistors 26 and 28 are grounded to ensure that the access transistors 30 and 32 are turned on and that the memory cell information is correctly read. Current flows through the second access transistor 32 and the second pull-down transistor 24 to ground, and through the first bipolar pull-up transistor 26 and the first access transistor 30 to the first column line 38. The gate voltage of the second pull-down transistor 24 does not fall below $V_{CC}/2$ and hence remains on. However, to prevent the memory cell 20 from altering state, the second pull-down transistor 24 is designed such that its conductance is much larger than the conductance of the second access transistor 24, so that the drain voltage of the transistor 24 does not rise above $V_t$.

The operation of the memory cell 20 in writing and reading a logic "0" is complementary to the operation for writing and reading a logic "1" as described above. It should be apparent that the conductance of the first access transistor 30 is much larger than the conductance of the first bipolar transistor 26 while the conductance of the first pull-down transistor 22 is much larger than the conductance of the first access transistor 30 for the same reasons described above with respect to writing and reading a logic "1".

It should also be apparent that the switching circuit 44 applies a first voltage, i.e. ground, to the first and second bases during a first switching mode, i.e either writing or reading, and a second voltage, i.e. either open or a negative voltage, to the first and second bases during a second switching mode, i.e. standby. The first and second voltages are control voltages which are coupled to the switching circuit 44 via a control voltage contact (not shown). The switching circuit 44 may only comprise the fifth transistor 46 if the bases are switched between ground and an open circuit. The control circuit may therefore comprise a clocking circuit (not shown) or a simple logic circuit (not shown) for controlling the state of the bases. Otherwise, if the bases are switched between the three voltage levels, the control circuit for the fifth and sixth transistors 46, 48 may comprise a multiplexor (not shown) and a simple logic circuit (not shown).

Figure 7:
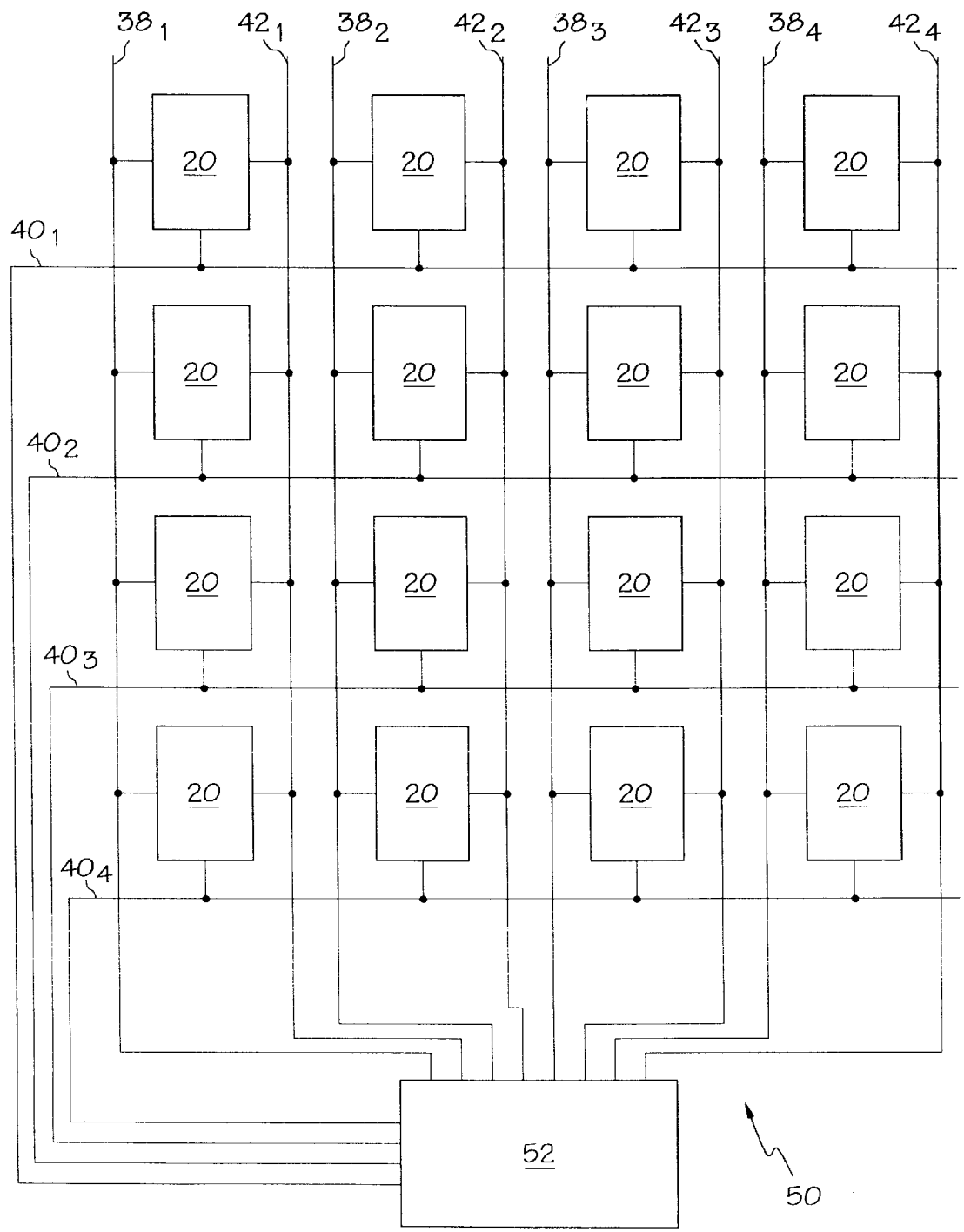
FIG. 7 illustrates schematically an SRAM memory array using the SRAM memory cell of FIG. 5.

Referring now to FIG. 7, it is contemplated by the present invention that the SRAM memory cell 20, described above with respect to FIG. 5, may be utilized to provide an SRAM memory array 50. The SRAM memory array 50 comprises a plurality of SRAM memory cells 20 arranged in a desired number of rows and columns. FIG. 7 depicts an illustrative 16 cell memory array having four (4) rows and four (4) columns. Each of the columns include respective first and second column lines $38_1$–$38_4$, $42_{1-42_4}$ while each of the rows include respective row lines $40_1$–$40_4$. The column and row lines $38_1$–$38_4$, $42_1$–$42_4$ and $40_1$–$40_4$ are coupled to a memory decoder 52. The memory decoder 52 is capable of assessing each of the memory cells 20 through a unique memory command conveyed on the column and row lines $38_1$–$38_4$, $42_1$–$42_4$ and $40_1$–$40_4$.

Figure 8:
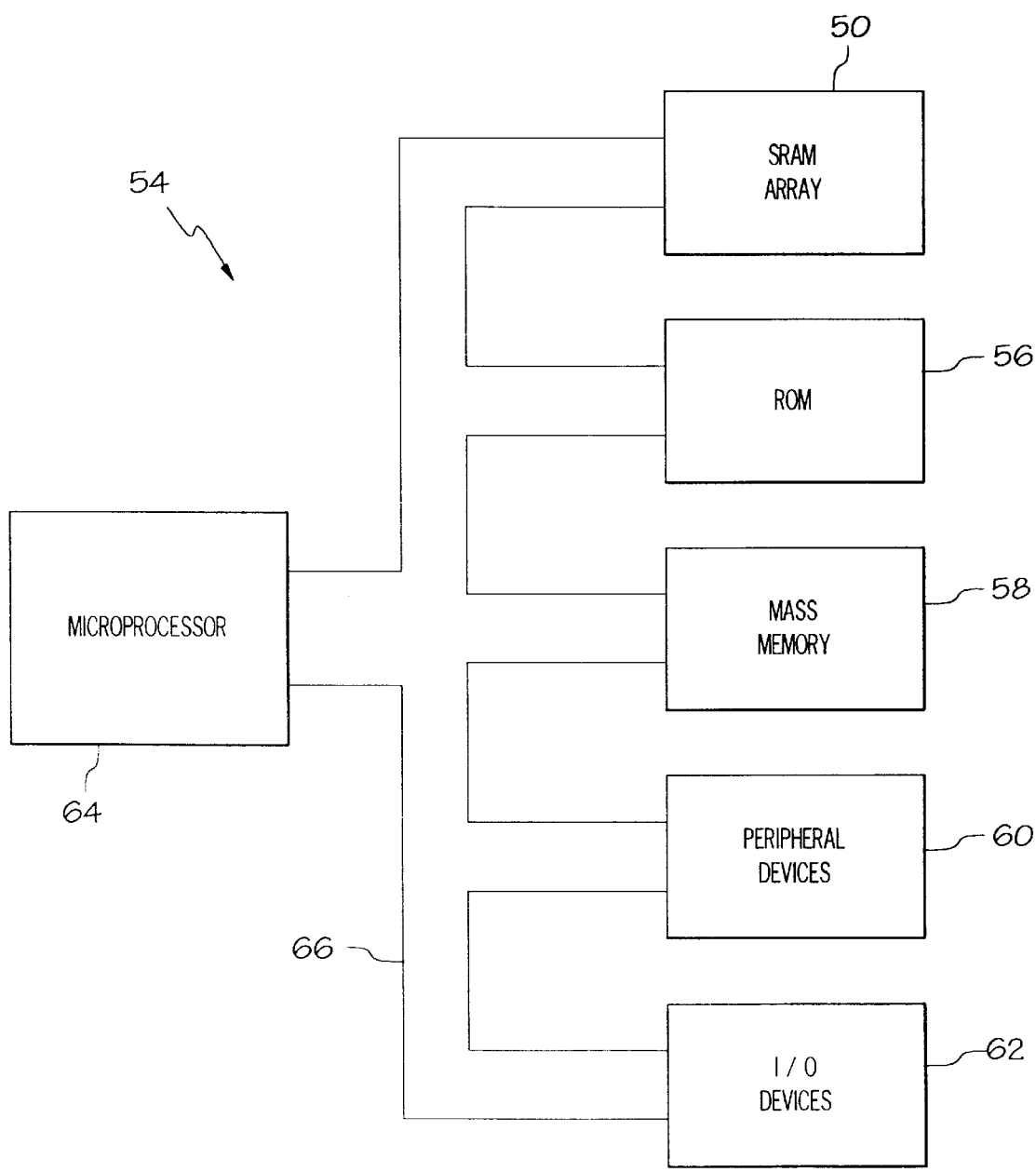
FIG. 8 illustrates schematically a computer system using the SRAM memory array of FIG. 7.

Referring now to FIG. 8, it is contemplated by the present invention that the SRAM memory array 50, described in detail above with respect to FIG. 7, may be utilized to provide an SRAM memory array 50 within a computer system 54. As will be appreciated by those skilled in the art, the computer system 54 would include a ROM 56, a mass memory 58, peripheral devices 60, and I/O devices 62 in communication with a microprocessor 64 via a data bus 66 or another suitable data communication path. The microprocessor 64 communicates with each of the plurality of memory cells 20 via the memory decoder 52.

Figure 9:
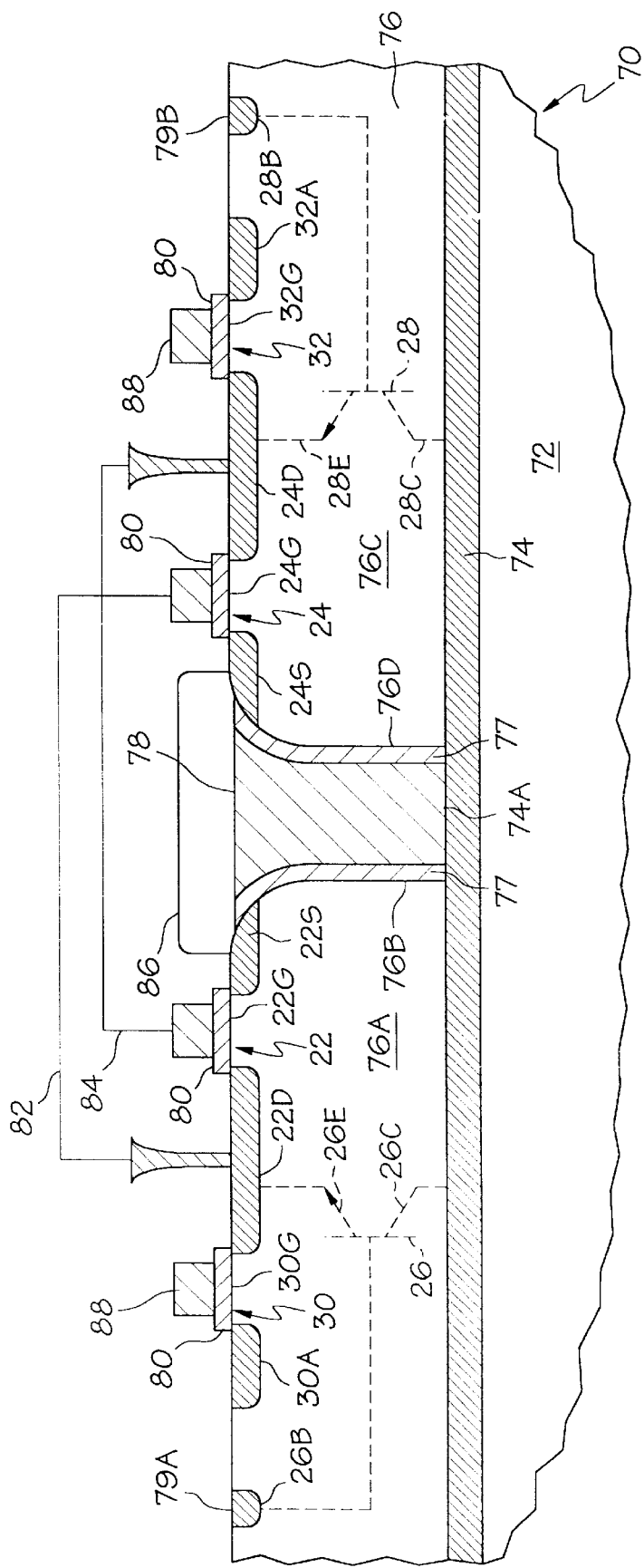
FIG. 9 is an enlarged, sectioned side view depicting the memory cell of FIG. 5 according to one aspect of the present invention.

Referring now to FIG. 9, a first method for forming the SRAM memory cell 20 will be described. The memory cell 20 is formed on a substrate assembly 70 comprising a semiconductor layer 72 which is silicon in the illustrated embodiment, and may also include additional layers or structures which define active or operable portions of semiconductor devices (not shown). For example, the semiconductor layer 72 of the substrate assembly 70 may be formed on insulating material, sapphire or another base material. The semiconductor layer 72 is doped with impurities to form a semiconductor of a first/p-type conductivity.

A first semiconductor layer 74 is formed over the semiconductor layer 72 using conventional methods, such as epitaxy, ion implantation or diffusion. In the illustrated embodiment, the first semiconductor layer 74 is a thin layer which comprises heavily doped n-type semiconductor material. The first layer 74 is a heavily doped buried layer to supply $V_{CC}$ to each cell of the memory array. A second semiconductor layer 76 is formed over the first semiconductor layer 74 and comprises p-type semiconductor material in the illustrated embodiment. The second semiconductor layer 76 may also be formed using the above conventional methods, however, in the illustrated embodiment, the second semiconductor layer 76 is epitaxially grown. The second semiconductor layer 76 extends over the first semiconductor layer 74 so that the first semiconductor layer 74 is a buried layer.

A portion of the second layer 76 is removed using conventional methods to expose a first portion 74A of the first layer 74. The second layer 76 now includes a second semiconductor region 76A having a second well face 76B and a third semiconductor region 76C having a third well face 76D. As illustrated in FIG. 9, the well faces 76B and 76C are mutually opposing. Well insulation material 77, such as silicon dioxide, is formed over the second and third well faces 76B, 76D using conventional methods. A semiconductor plug structure 78 is formed over said first portion 74A of the first semiconductor layer 74, contacting the first portion 74A as well as the second and third well faces 76B, 76D. In the illustrated embodiment, the semiconductor plug structure 78 is a conductive plug and may be formed from appropriately doped polysilicon or metallic material, such as tungsten.

Buried contacts for the first source 22S and the first drain 22D of the first pull-down transistor 22 are formed in the second semiconductor region 76A while buried contacts for the second source 24S and the second drain 24D of the second pull-down transistor 24 are formed in the third semiconductor region 76C using conventional methods. The term buried contact as used herein refers to any contact which is formed beneath a passivating layer or other layers. A buried contact 30A for the source/drain of the first access transistor 30 is formed in the second semiconductor region 76A while a buried contact 32A for the source/drain of the second access transistor 32 is formed in the third semiconductor region 76C using conventional methods. The other source/drain contact of the first access transistor 30 is common with the drain contact 22D of the transistor 22 while the other source/drain contact of the second access transistor 32 is common with the drain contact 24D of the transistor 24. Additionally, buried contacts 79A and 79B are formed using conventional methods in the second and third semiconductor regions 76A and 76C, respectively.

A gate oxide or insulation layer 80 is formed over the second semiconductor layer 76 using conventional methods for forming the first gate 22G of the transistor 22, the second gate 24G of the transistor 24, the third gate 30G of the transistor 30 and the fourth gate 32G of the transistor 32. A first conductive layer 82, shown schematically in FIG. 9, is formed using conventional methods for coupling the first drain 22D to the second gate 24G. Similarly, a second conductive layer 84, also shown schematically in FIG. 9, is formed using conventional methods for coupling the first gate 22G to the second drain 24D. A third conductive layer 86, shown schematically in FIG. 9, may be formed using conventional methods for coupling the first and second sources 22S, 24S together and for eventual coupling to the second voltage source $V_{SS}$ via a second voltage source contact (not shown). Another conductive layer 88 is formed using conventional methods for coupling the gates 30G and 32G to the row line (not shown). In the illustrated embodiment, the conductive layers 82, 84, 86 and 88 comprise polysilicon. It will be appreciated by those skilled in the art that the above process includes the formation of appropriate insulation layers as well as additional metalization layers and a BPSG protective layer. It will be further appreciated by those skilled in the art that the formation of one or more of the conductive layers 82, 84, 86 and 88 may be combined into one or more steps. It will be even further appreciated by those skilled in the art that the above described layers and structures may be performed in any reasonable order. Further, the above process may include appropriate annealing steps.

The first bipolar pull-transistor 26, shown in phantom, is parasitically formed by the first and second semiconductor layers 74 and 76 with the first collector 26C corresponding to the first layer 74, the first base 26B corresponding to the second semiconductor region 76A and electrically controlled through buried contact 79A, and the first emitter 26E corresponding to the first drain buried contact 22D. Similarly, the second bipolar pull-transistor 28, shown in phantom, is parasitically formed by the first and second semiconductor layers 74 and 76 with the second collector 28C corresponding to the first layer 74, the second base 28B corresponding to the second semiconductor region 76C and electrically controlled through buried contact 79B, and the second emitter 28E corresponding to the second drain buried contact 24D. In the illustrated embodiment, the first and second collectors 26C and 28C are coupled to a first voltage source contact which supplies $V_{CC}$, through the semiconductor plug structure 78. Another semiconductor layer (not shown) may be formed using conventional methods for coupling the buried contacts 79A and 79B, and hence the first and second bases 26B and 28B together. The bipolar transistors 26 and 28 may be referred to as vertical bipolar transistors as the transistors 26 and 28 are formed vertically within the semiconductor material. Similarly, as discussed with respect to FIG. 6, the bipolar transistors 26 and 26 may be referred to as vertical back-to-back vertical diodes. Further, the bipolar transistors 26 and 28 are considered buried pull-up devices for an SRAM memory device.

Figure 10:
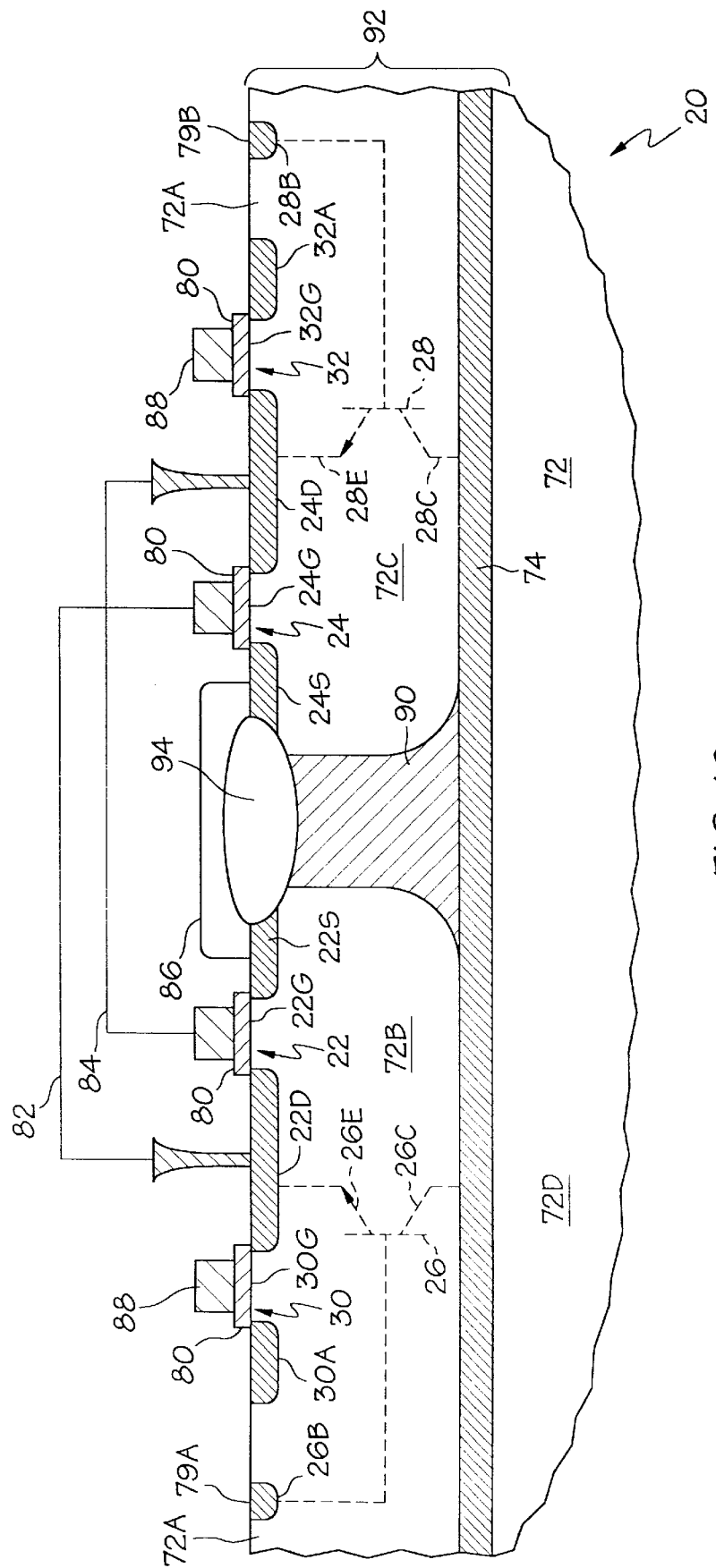
FIG. 10 is an enlarged, sectional side view depicting the memory cell of FIG. 5 according to another aspect of the present invention.

Referring now to FIG. 10, another method for forming the SRAM memory cell 20 will be described in detail. The memory cell 20 in this method is also formed on the substrate assembly 70 comprising the semiconductor layer 72 which is p-type silicon in the illustrated embodiment, and may also include the additional layers or structures which define active or operable portions of semiconductor devices (not shown).

The heavily doped n-type first semiconductor layer 74 is ion implanted within the semiconductor layer 72 using high energy ion implantation, such as a million electron volts. A semiconductor well structure 90, comprising n-type silicon semiconductor material in the illustrated embodiment, is formed within the semiconductor layer 72 so as to make surface contact with the first layer 74. The semiconductor well structure 90 separates an upper portion 72A of the semiconductor layer 72 into a second semiconductor region 72B and a third semiconductor region 72C while first semiconductor layer 74 separates the second and third semiconductor regions 72B and 72C from a first semiconductor region 72D. The first, second and third semiconductor regions 72B, 72C and 72D form a semiconductor structure 92 which is formed within and substantially includes the semiconductor layer 72.

Insulation material 94, such as silicon dioxide, is formed over the semiconductor well structure 90 using conventional methods, such as Local Oxidation of Silicon (LOCOS). It will be appreciated by those skilled in the art that trench isolation techniques may be used in place of the insulation material 94 without departing from the scope of the present invention.

The process for forming the memory cell 20 now proceeds in the same manner as the process described with reference to FIG. 9. Specifically, the buried contacts 22S, 22D, 30A and 79A are formed in the second semiconductor region 72B and the buried contacts 24S, 24D, 32A and 79B are formed in the third semiconductor region 72C using conventional methods. The insulation layer 80 for the forming the gates 22G, 24G, 30G and 32G is formed using conventional methods. The conductive layers 82, 84, 86 and 88 are also formed using conventional methods. The parasitic bipolar transistors 26 and 28 are also derived in the same manner. The first layer 74 may be coupled to the first voltage source contact by removing a portion of the insulation material 94 using conventional methods to expose a portion of the well structure 90. An appropriate conductive or metalization layer may then be added to couple to the first layer 74 to the first voltage source contact.

Figure 11:
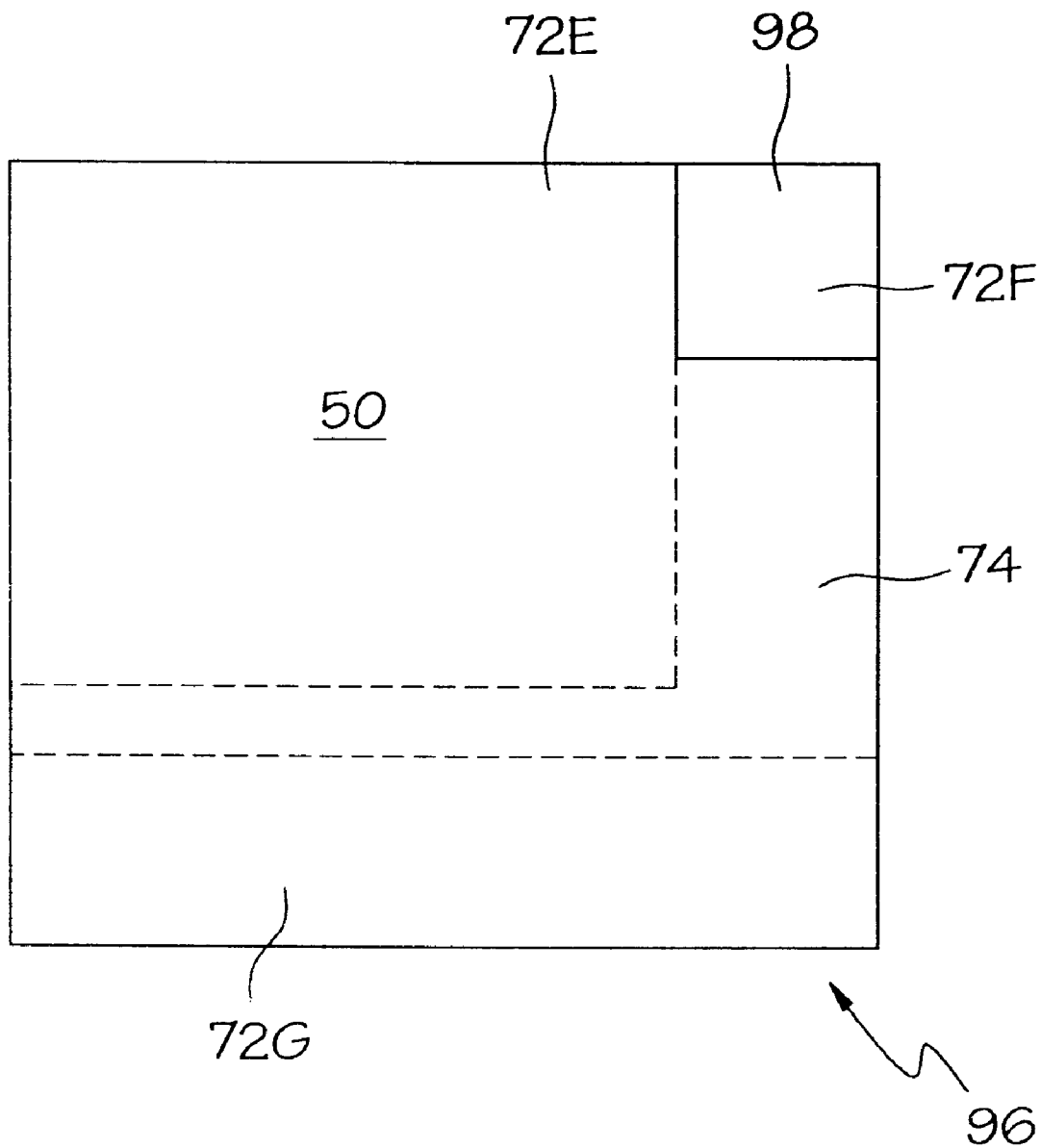
FIG. 11 is a block diagram of the SRAM memory array according to yet another aspect of the present invention.
Figure 12:
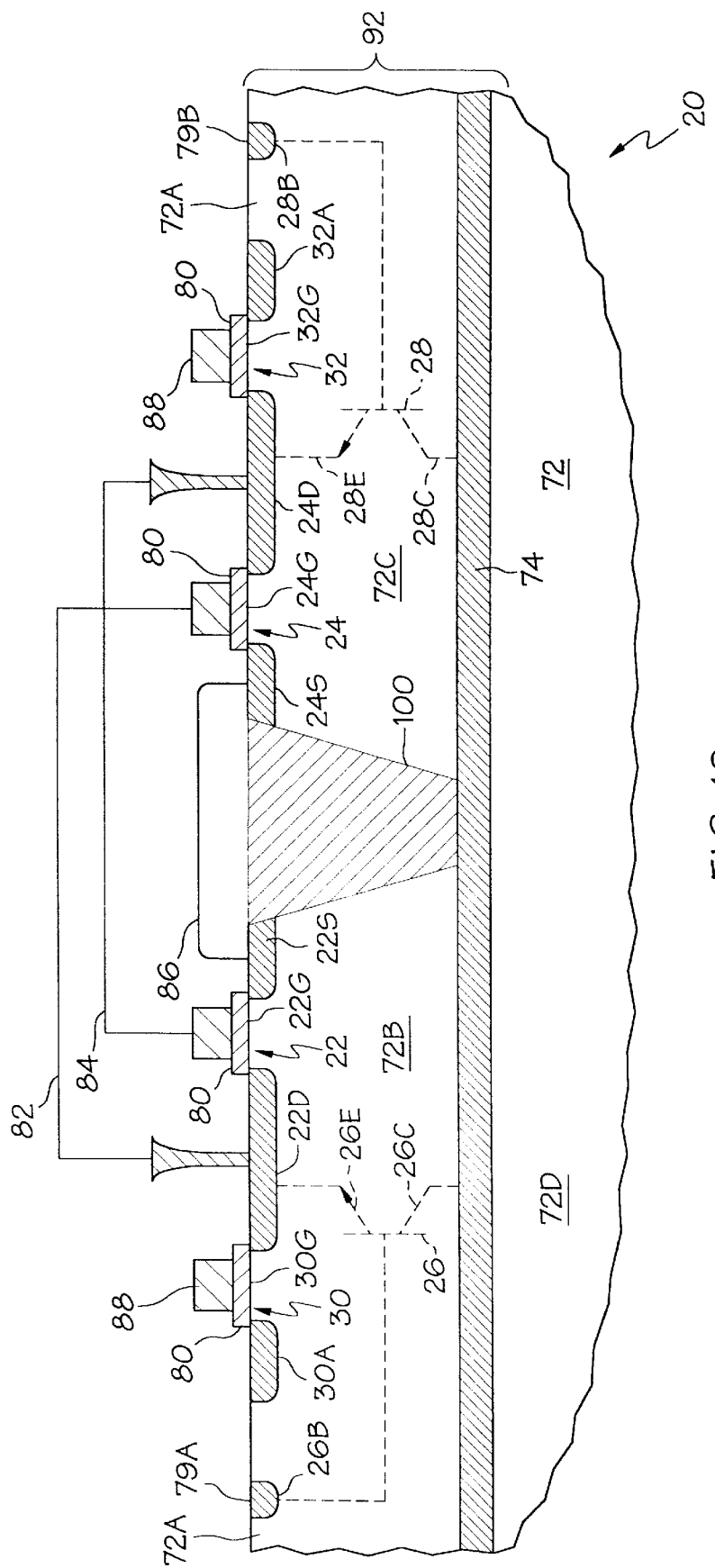
FIG. 12 is an enlarged, sectional side view depicting the memory cell of FIG. 5 according to another aspect of the present invention.

The above processes may be used to form the SRAM memory array 50 comprising a plurality of the memory cells 20 by using standard fabrication techniques. The first layer 74, which is common to each memory cell 20 of the array 50, may be coupled to the first voltage source contact at a single location so as to reduce the number of connections and processing steps for coupling each semiconductor well structure 90 or plug structure 78 to the first voltage source contact. Referring now to FIG. 11, the memory array 50 is formed on a chip 96. The plurality of memory cells 20 of the array 50 are positioned within a first portion 72E of the semiconductor layer 72. The first semiconductor layer 74 is common to each memory cell 20 and coupled to a well structure 98 positioned within a second portion 72F of the semiconductor layer 74. The well structure 98 comprises conductive material, such as polysilicon, and contacts the first layer 74. The well structure 98 is situated within a well formed using conventional methods. Another portion 72G of the first semiconductor layer may be used to form the memory decoder 52 of the memory 50. Each of the memory cells 20 are also appropriately coupled to respective first and second columns lines 38 and 42 and row line 40. The plug structure 78 or the well structure 90 may then be replaced by a trench isolation structure 100 comprising silicon dioxide or other similar insulating material as shown in FIG. 12. A trench for the trench isolation structure 12 may be formed using conventional methods in either of the embodiments illustrated in FIGS. 9 and 10. The plug structure 78, the well structure 90 and the trench isolation structure 100 may be also referred to as an isolation structure.

Having described the invention in detail and by reference to preferred embodiments thereof, it will be apparent that modifications and variations are possible without departing from the scope of the invention which is defined in the appended claims.

What is claimed is:

1. A method of fabricating an SRAM memory cell comprising:

forming a substrate assembly having at least one semiconductor layer;

forming a first semiconductor layer over said at least one semiconductor layer;

forming a second semiconductor layer over said first semiconductor layer;

removing a portion of said second semiconductor layer to expose a first portion of said first semiconductor layer, said second semiconductor layer comprising a second semiconductor region having a second well face and a third semiconductor region having a third well face;

forming an isolation structure in said portion of said second semiconductor layer;

forming contacts for a first source and a first drain of a first transistor in said second semiconductor region;

forming contacts for a second source and a second drain of a second transistor in said third semiconductor region;

forming an insulation layer for a first gate for said first transistor and a second gate for said second transistor;

forming a first conductive layer for coupling said first drain to said second gate; and forming a second conductive layer for coupling said first gate to said second drain;

wherein a first bipolar transistor is formed having a first collector corresponding to said first semiconductor layer, a first base corresponding to said second semiconductor region, and a first emitter corresponding to said first drain contact;

and wherein a second bipolar transistor is formed having a second collector corresponding to said first semiconductor layer, a second base corresponding to said third semiconductor region, and a second emitter corresponding to said second drain contact.

2. The method of claim 1, further comprising the act of forming contacts for said second semiconductor region and said third semiconductor region.

3. The method of claim 1, wherein the act of forming an isolation structure comprises the acts of:

forming insulation material over said second and third well faces; and forming a structure over said first portion of said first semiconductor layer.

4. The method of claim 3, wherein said structure over said first portion of said first semiconductor layer comprises polysilicon material.

5. The method of claim 3, wherein said structure over said first portion of said first semiconductor layer comprises metallic material.

* * * * *

UNITED STATES PATENT AND TRADEMARK OFFICE
CERTIFICATE OF CORRECTION

PATENT NO : 6,187,618
DATED : February 13, 2001
INVENTOR(S) : Kao et al

It is certified that error appears in the above-identified patent and that said Letters Patent is hereby corrected as shown below:

Under the invention title in column 1, the following paragraph should be added:

--This invention was made with United States Government support under contract no. MDA972-92-C-0054 awarded by the Advanced Research Projects Agency (ARPA). The United States Government has certain rights in this invention.--

Signed and Sealed this

Fifteenth Day of May, 2001

*Attest:*

NICHOLAS P. GODICI

*Attesting Officer*     *Acting Director of the United States Patent and Trademark Office*

UNITED STATES PATENT AND TRADEMARK OFFICE
CERTIFICATE OF CORRECTION

PATENT NO : 6,187,618 B1
DATED : February 13, 2001
INVENTOR(S) : David Y. Kao and Fawad Ahmed It is certified that error appears in the above-identified patent and that said Letters Patent is hereby corrected as shown below:

On title page
Inventor's name "David A. Kao" should be spelled --David Y. Kao--.

Signed and Sealed this

Twenty-ninth Day of May, 2001

*Attest:*

NICHOLAS P. GODICI

*Attesting Officer*  *Acting Director of the United States Patent and Trademark Office*